(12) United States Patent
Deguchi et al.

(10) Patent No.: US 9,431,989 B2
(45) Date of Patent: Aug. 30, 2016

(54) POWER TRANSMITTING DEVICE, ELECTRONIC EQUIPMENT AND WIRELESS POWER TRANSMISSION SYSTEM

(71) Applicant: PANASONIC CORPORATION, Osaka (JP)

(72) Inventors: Futoshi Deguchi, Fukuoka (JP); Yasuhito Yuasa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/389,006

(22) PCT Filed: Mar. 29, 2013

(86) PCT No.: PCT/JP2013/002199
§ 371 (c)(1),
(2) Date: Sep. 29, 2014

(87) PCT Pub. No.: WO2013/145788
PCT Pub. Date: Oct. 3, 2013

(65) Prior Publication Data
US 2015/0054351 A1    Feb. 26, 2015

(30) Foreign Application Priority Data

Mar. 30, 2012 (JP) .................................. 2012-079155

(51) Int. Cl.
*H03H 7/38* (2006.01)
*H01F 38/14* (2006.01)
(Continued)

(52) U.S. Cl.
CPC ................ *H03H 7/38* (2013.01); *H01F 38/14* (2013.01); *H02J 5/005* (2013.01); *H02J 7/025* (2013.01)

(58) Field of Classification Search
CPC .......... H03H 7/38; H01F 38/14; H02J 7/025; H02J 5/005
See application file for complete search history.

(56) References Cited

U.S. PATENT DOCUMENTS 8,305,036 B2    11/2012  Toya et al.
8,432,066 B2     4/2013  Takada et al.
(Continued)

FOREIGN PATENT DOCUMENTS

JP    2009-247194    10/2009
JP    2010-114965     5/2010
(Continued)

OTHER PUBLICATIONS

International Search Report from PCT/JP2013/002199, mail date is Jun. 4, 2013, together with English translation thereof.

*Primary Examiner* — Zeev V Kitov
(74) *Attorney, Agent, or Firm* — Greenblum & Bernstein, P.L.C.

(57) ABSTRACT

Reduction in the power transmission efficiency due to imprecise positioning between a primary power transmission coil and a secondary power reception coil is avoided. For transmitting electric power in a wireless manner to an electronic device including a secondary power reception coil and configured to receive electric power via the secondary power reception coil, a power transmission device includes a primary power transmission coil and a power transmission circuit unit for supplying electric power to the primary power transmission coil, and a transmission circuit unit is formed by the primary power transmission coil and the secondary power reception coil. A first impedance of an input end of the transmission circuit unit is matched with a second impedance of an output end of the transmission circuit unit by using a coupling coefficient between the primary power transmission coil and the secondary power reception coil.

19 Claims, 18 Drawing Sheets

(51) Int. Cl.
*H02J 7/02* (2016.01)
*H02J 5/00* (2016.01)

(56) References Cited

U.S. PATENT DOCUMENTS

| | | | |
|---|---|---|---|
| 8,552,684 B2* | 10/2013 | Tabata et al. | 320/108 |
| 8,786,252 B2 | 7/2014 | Toya et al. | |
| 2009/0153098 A1 | 6/2009 | Toya et al. | |
| 2010/0115474 A1 | 5/2010 | Takada et al. | |
| 2010/0213770 A1* | 8/2010 | Kikuchi | 307/104 |
| 2011/0049995 A1* | 3/2011 | Hashiguchi | 307/104 |
| 2011/0196544 A1* | 8/2011 | Baarman | H01F 38/14 |
| | | | 700/291 |
| 2012/0038220 A1* | 2/2012 | Kim | H02J 7/025 |
| | | | 307/104 |
| 2012/0146580 A1 | 6/2012 | Kitamura | |
| 2012/0161535 A1* | 6/2012 | Jung et al. | 307/104 |
| 2012/0242158 A1* | 9/2012 | Lee | H02J 5/005 |
| | | | 307/104 |
| 2012/0262002 A1* | 10/2012 | Widmer | H04B 5/0037 |
| | | | 307/104 |
| 2014/0028253 A1 | 1/2014 | Toya et al. | |
| 2014/0175896 A1* | 6/2014 | Suzuki | H03H 7/40 |
| | | | 307/104 |

FOREIGN PATENT DOCUMENTS

| | | |
|---|---|---|
| JP | 2010-268610 | 11/2010 |
| JP | 2011-050140 | 3/2011 |
| WO | 2009/037821 | 3/2009 |

* cited by examiner

POWER TRANSMITTING DEVICE, ELECTRONIC EQUIPMENT AND WIRELESS POWER TRANSMISSION SYSTEM

TECHNICAL FIELD

The present invention relates to a wireless power transmission system for transmitting electric power from a power transmitting device to an electronic device in a wireless manner by detachably attaching the electronic device to the power transmission device or by bringing the electronic device close to the power transmission device.

BACKGROUND OF THE INVENTION

Conventionally known is the wireless power transmission system which transmits electric power from a primary power transmission coil provided on the power transmission side to a secondary power reception coil provided on the power reception side such as an electronic device and a vehicle. Owing to the absence of any exposed contact members, the wireless power transmission requires no special water proofing arrangement, and is free from the problems of the failures and degradations of the contact members. The primary power transmission coil and the secondary power reception coil that are contained in the electronic device or the like typically consisted of coil windings wound around cores or bobbins.

In a typical wireless power transmission system, the utility power is converted into high frequency AC power by using a high frequency converter circuit before being fed to the primary power transmission coil, and a high frequency AC magnetic flux at the frequency of 60 to 600 kHz is created in the primary power transmission coil. By means of electromagnetic induction, AC power is induced in the secondary power reception coil provided in the electronic device on the secondary power receiving side, and this power is rectified by a rectifying/smoothing circuit on the secondary power receiving side before being supplied to a rechargeable battery.

Conventionally, when a rechargeable battery of an electronic device is to be recharged by using a power transmission device, the electronic device is placed on the power transmission device. The power transmission efficiency is strongly influenced by the relative position between the electronic device and the power transmission device. If the two parts are not properly aligned, the transmission efficiency sharply drops. When a plurality of electronic devices are to be placed on a single power transmission device at the same time, it is known to assign different priorities to the different electronic devices and to recharge the batteries of different electronic devices on a time sharing basis.

As such a known technology, Patent Document 1 discloses a recharging table including a case having an upper plate to place a battery-incorporated device thereon, a position detecting control unit for detecting the position of the battery-incorporated device, a power source coil (primary power transmission coil) and an actuator for moving the power source coil to the proximity of the induction coil (secondary power reception coil) of the battery-incorporated device.

Patent Document 2 discloses a recharger including a plurality of recharger units each configured to recharge a battery-incorporated device placed in the corresponding recharging area in a contactless manner, a priority assigning unit for assigning different priorities of recharging to the battery-incorporated devices, and a control unit for controlling the supply of electric current to the battery-incorporated devices, wherein the control unit determines the distribution of electric current to the different recharger units from the given amount of available electric current according to the priorities assigned by the priority assigning unit. The recharger is configured to preferentially recharge the battery-incorporated devices assigned with higher priorities when recharging the battery-incorporated devices in a contactless manner.

PRIOR ART DOCUMENT(S)

Patent Document(s)

Patent Document 1: JP2009-247194A
Patent Document 2: JP2010-268610A

SUMMARY OF THE INVENTION

Task to be Accomplished by the Invention

However, according to the recharging table disclosed in Patent Document 1, the need for the actuator for moving the power source coil to the proximity of the induction coil inevitably increases the cost.

According to the recharger disclosed in Patent Document 2, a plurality of power transmission coils and a corresponding number of power transmission coil energizing units are required in order to recharge a plurality of battery-incorporated devices, and this inevitably requires a high cost. Also, each power transmission coil can recharge only one battery-incorporated device, and cannot recharge a plurality of battery-incorporated devices at the same time.

The present invention was made in view of such problems of the prior art, and has a primary object to provide a power transmission device, an electronic device and a wireless power transmission system that can ensure a high power transmission efficiency without requiring any precise positioning of the secondary power reception coil with respect to the primary power transmission coil. A second object of the present invention is to provide a power transmission device, an electronic device and a wireless power transmission system that can supply electric power to a plurality of secondary power reception coils by using a single primary power transmission coil.

Means to Accomplish the Task

The present invention provides a power transmission device for transmitting electric power in a wireless manner to an electronic device, the electronic device including a secondary power reception coil and being configured to receive electric power via the secondary power reception coil, the power transmission device comprising: a primary power transmission coil; and a power transmission circuit unit for supplying electric power to the primary power transmission coil; a transmission circuit unit being formed by the primary power transmission coil and the secondary power reception coil; wherein a first impedance of an input end of the transmission circuit unit is matched with a second impedance of an output end of the transmission circuit unit by using a coupling coefficient between the primary power transmission coil and the secondary power reception coil.

The present invention also provides an electronic device configured to receive electric power from a power transmission device, the power transmission device including a primary power transmission coil and being configured to transmit electric power via the primary power transmission coil, the electronic device comprising: a secondary power reception coil; and a power reception circuit unit configured to receive electric power via the secondary power reception coil; a transmission circuit unit being formed by the primary power transmission coil and the secondary power reception coil; wherein a second impedance of an output end of the transmission circuit unit is matched with a first impedance of an input end of the transmission circuit unit by using a coupling coefficient between the primary power transmission coil and the secondary power reception coil.

The present invention further provides a wireless power transmission system, comprising: a transmission circuit unit including a primary power transmission coil and a secondary power reception coil; a power transmission circuit unit configured to transmit power via the primary power transmission coil; a power reception circuit unit configured to receive power via the secondary power reception coil; wherein a first impedance of an input end of the transmission circuit unit is matched with a second impedance of an output end of the transmission circuit unit by using a coupling coefficient between the primary power transmission coil and the secondary power reception coil.

The wireless power transmission system of the present invention allows electric power to be transmitted from a primary power transmission coil to an electronic device having a secondary power reception coil in a contactless manner. The primary power transmission coil may consist of a vertical helical coil formed by winding a linear conductor helically around a central axial line in parallel with the central axial line of the secondary power reception coil, and the open end of the primary power transmission coil may have an area large enough to place a plurality of secondary power reception coils thereon.

Effect of the Invention

In the wireless power transmission system of the present invention, because the input and output impedances of the transmission circuit unit are matched by using the coupling coefficient between the primary power transmission coil and the secondary power reception coil, the reduction in the power transmission efficiency due to the imprecise positioning of the secondary power reception coil on the primary power transmission coil can be minimized.

According to the wireless power transmission system of the present invention, when the primary power transmission coil consists of a vertical helical coil, the magnetic flux generated by the primary power transmission coil can be made substantially uniform so that electric power can be favorably transmitted to an electronic device provided with a secondary power reception coil without requiring precise positioning between the primary power transmission coil and the secondary power reception coil.

DESCRIPTION OF THE PREFERRED EMBODIMENT(S)

Figure 1:
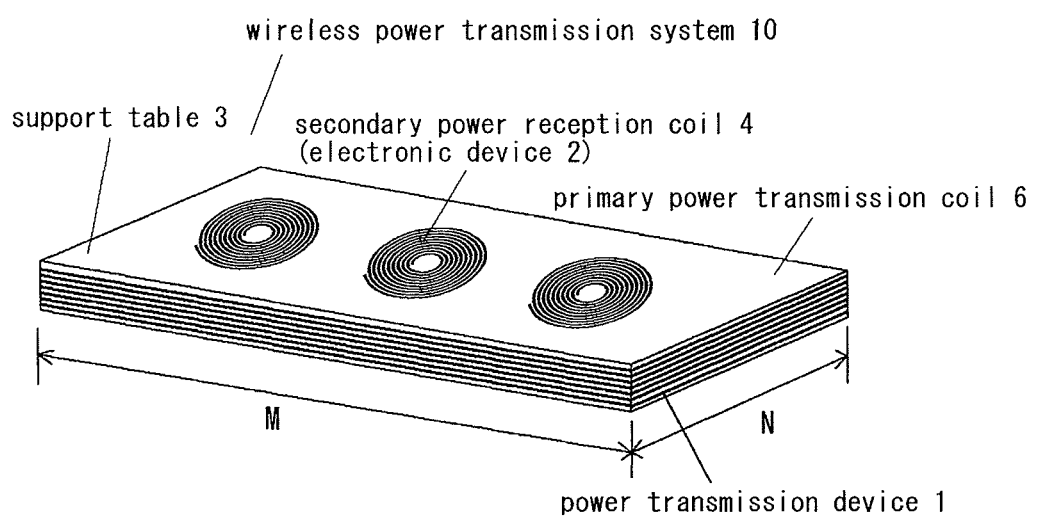
FIG. 1 is a perspective view showing a first embodiment of the wireless power transmission system of the present invention.

The wireless power transmission system based on the first aspect of the present invention allows electric power to be transmitted from a primary power transmission coil to an electronic device having a secondary power reception coil in a contactless manner. The primary power transmission coil may consist of a vertical helical coil formed by winding a linear conductor helically around a central axial line in parallel with the central axial line of the second power reception coil, and the open end of the primary power transmission coil may have an area large enough to place a plurality of secondary power reception coils thereon.

When transmitting electric power to a secondary power reception coil from a primary power transmission coil having a larger area than the secondary power reception coil, the transmission efficiency depended on the position of the electronic device when conventional power transmission and reception coils were used. For instance, the power transmission efficiency changed depending on if the secondary power reception coil is placed on the central part of the primary power transmission coil or an end region thereof. The power transmission efficiency of transmitting electric power to the electronic device is favorable when the secondary power reception coil is placed on the central part of the primary transmission coil, but significantly drops if the secondary power reception coil is placed on an end region of the primary power transmission coil.

When the primary power transmission coil consists of a vertical helical coil formed by winding a linear conductor helically around an axial line in parallel with the central axial line of the secondary power reception coil, variations in the magnitude of the magnetic flux (magnetic flux density) over the entire area of the helical coil can be minimized. Therefore, the variations in the coupling coefficient depending if the secondary power reception coil is placed on the central part of the primary transmission coil or an end region of the primary power transmission coil can be minimized. Therefore, without regard to where on the primary power transmission coil the electronic device incorporated with the secondary power reception coil may be placed, be it the central part or the peripheral part of the primary power transmission coil, a favorable electric power transmission to the electronic device can be accomplished without requiring any precision position between the primary power transmission coil and the secondary power reception coil.

According to a second aspect of the present invention, the wireless power transmission system includes a transmission circuit unit including a primary capacitor that forms a series resonance circuit in cooperation with the primary power transmission coil and a secondary capacitor that forms a series resonance circuit in cooperation with the secondary power reception coil.

According to the second aspect of the present invention, by achieving an input and output impedance matching in the transmission circuit unit including the primary power transmission coil and the secondary power reception coil each forming a series resonance circuit, the variations in the coupling coefficient between the primary power transmission coil and the secondary power reception coil can be minimized so that a positioning free power feeding can be achieved.

According to a third aspect of the present invention, in the wireless power transmission system, an open end of the primary power transmission coil is provided with a rectangular shape, and has a short side length less than four times the diameter of the secondary power reception coil and a long side length less than six times the diameter of the secondary power reception coil.

If the short side length is more than four times the diameter of the secondary power reception coil, the transmission efficiency tends to drop. Even when the short side length is less than four times the diameter of the secondary power reception coil, if the long side length is more than six times the diameter of the secondary power reception coil, the transmission efficiency tends to drop owing to the reduction in the coupling coefficient between the primary power transmission coil and the secondary power reception circuit. However, by selecting the relationship of the long side length and the short side length of the open end of the primary power transmission coil with the diameter of the secondary power reception coil, a drop in the transmission efficiency can be avoided.

According to a fourth aspect of the present invention, the wireless power transmission system further comprises a power transmission circuit unit configured to transmit power via the primary power transmission coil, and a power reception circuit unit configured to receive power via the secondary power reception coil, and the following relationships hold $$L_1 = Z_1/\omega K$$

$$L_2 = Z_2/\omega K$$

$$C_1 = 1/L_1\omega^2$$

$$C_2 = 1/L_2\omega^2$$

where $Z_1$ is the impedance of the transmission circuit unit as seen from the power transmission circuit unit, $Z_2$ is the impedance of the reception circuit unit, K is the coupling coefficient between the primary power transmission coil and the secondary power reception coil, $L_1$ is the self inductance of the primary power transmission coil, $L_2$ is the self inductance of the secondary power reception circuit, and $\omega$ is the angular frequency of the AC power transmitted from the primary power transmission coil.

Conventionally, the value of the coupling coefficient between the primary power transmission coil and the secondary power reception coil was raised to a high value (close to 1) by bringing the distance between the two coils extremely small in order to maximize the efficiency of electric power transmission from the primary power transmission coil to the secondary power reception coil. However, if there is any misalignment between the two coils or any change in the distance between the two coils, the power transmission efficiency sharply dropped.

If a favorable impedance matching is not achieved between the transmission circuit unit including the primary power transmission coil and the secondary power reception coil, the power transmission circuit unit for supplying electric power to the transmission circuit unit, and the power reception circuit unit for receiving electric power from the transmission circuit unit, the coupling coefficient changes significantly depending on the position of the secondary power reception coil relative to the primary power transmission coil. Therefore, some difficulty is encountered in transmitting electric power to the electronic device incorporated with a secondary power reception coil depending on the position of the secondary power reception coil (depending on the positional relationship between the primary power transmission coil and the secondary power reception coil). Also, when transmitting electric power from a single power transmission coil to a plurality of power reception coils or when transmitting electric power from a single power transmission device to a plurality of electronic devices, the coupling coefficient varies depending on the position of each electronic device in the open end of the primary power transmission coil so that some difficulty is experienced in transmitting electric power to the electronic devices.

According to the fourth aspect of the present invention, an impedance matching is achieved in the transmission circuit unit including the primary power transmission coil and the secondary power reception coil (each forming a series resonance circuit) for the power reception circuit unit and the power transmission circuit unit.

As a result, no matter where in the open end of the primary power transmission coil the electronic device incorporated with a secondary power reception coil may be, the power transmission device can supply the necessary electric power to the electronic device via the primary power transmission coil, and the electronic device can receive the electric power via the secondary power reception coil. In other words, without regard to the position of the electronic device, the variations in the magnetic coupling between the primary power transmission coil and the secondary power reception coil can be minimized so that a positioning free power feeding can be accomplished.

Also, when a plurality of electronic devices are to be placed on the open end of the primary power transmission coil, the power transmission device can supply an amount of electric power corresponding to the total sum of the electric power required by individual electronic devices from the primary power transmission coil, and each secondary power reception coil can receive the corresponding electric power at the same time so that a multi power feeding can be achieved.

The preferred embodiments of the present invention are described in the following with reference to the appended drawings.

<Structure of the Wireless Power Transmission System>

The wireless power transmission system of the present invention comprises a power transmission device 1 and an electronic device 2 given as a power reception device incorporated with a rechargeable battery.

The wireless power transmission system of the present invention is described in the following with reference to FIGS. 1 to 8.

Figure 2:
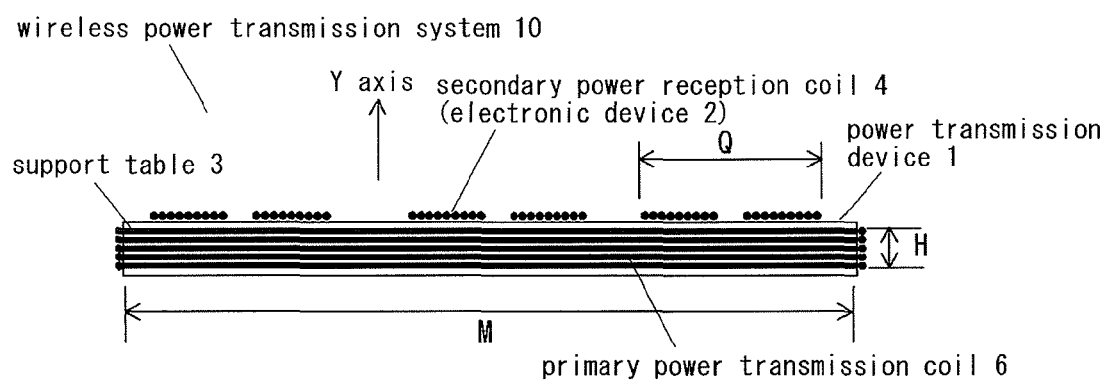
FIG. 2 is a sectional view showing the first embodiment of the wireless power transmission system of the present invention.
Figure 3:
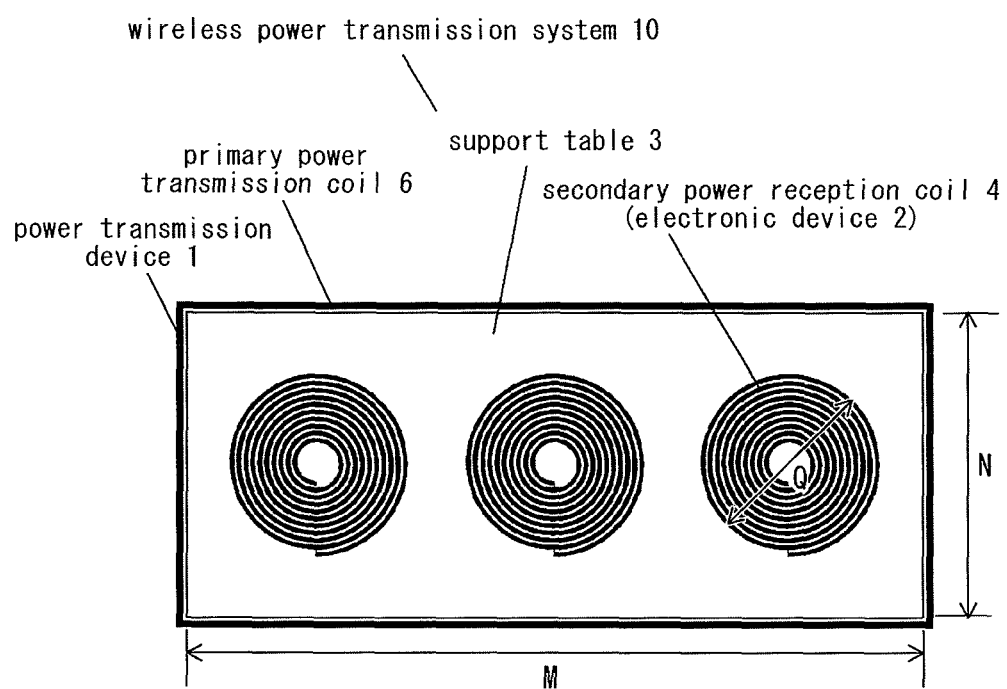
FIG. 3 is a plan view showing the first embodiment of the wireless power transmission system of the present invention.

FIG. 1 is a perspective view showing a first embodiment of the wireless power transmission system of the present invention, FIG. 2 is a sectional view showing the first embodiment of the wireless power transmission system of the present invention, and FIG. 3 is a plan view showing the first embodiment of the wireless power transmission system of the present invention Referring to FIGS. 1 to 3, the wireless power transmission system 10 comprises a power transmission device 1 including a primary power transmission coil 6 and a plurality of electronic devices 2 each including a secondary power reception coil 4, and the electronic devices 2 are positioned on a support table 3 of the power transmission device 1. The power transmission device 1 transmits power to the secondary power reception coils 4 via the primary power transmission coil 6, and each electronic device 2 receives electric power via the secondary power reception coil 4 thereof, and stores the received electric power in the rechargeable battery (not shown in the drawings) incorporated therein.

In FIGS. 1 to 8 and 10 which will be referred to in the following description, for the convenience of illustration, only the secondary power reception coils 4 are illustrated in lieu of the electronic devices 2. In other words, the case containing the secondary power reception coil 4 and the rechargeable battery of each electronic device 2 are omitted from the illustration.

The primary power transmission coil 6 consists of a rectangular helical coil having long sides measuring M (mm), short sides measuring N (mm) and a height measuring H (mm). The height H is measured as the distance between the top most wire and the lower most wire wound around the side of the support table 3.

As opposed to the flat spiral coil having coil wire wound in a spiral configuration on a plane, the primary power transmission coil 6 consists of a vertical helical coil made of a plurality of turns of wire made of conducting material such as copper wound around a three-dimensional insulating member. The "vertical" as used herein means that the wire is wound around an axial line with a prescribed lead in the axial direction. In such a vertical helical coil, the magnetic flux is generated in the axial direction of the coil or along the Y axis (see FIG. 2). The turns of the wire may consist of a single layer around the side of the insulating member, and the wire may consist of Litz wire consisting of thin wire strands, individually insulated and twisted or woven together. The number of turns may be determined by the size of the power transmission device 1, and the required inductance value of the primary power transmission coil.

The electronic devices 2 placed on the support table 3 of the power transmission device 1 are each incorporated with a secondary power reception coil 4 consisting of a planar spiral coil. The central axial line of each secondary power reception coil 4 preferably extends in parallel with the axial line of the primary power transmission coil 6 or the axial line of the magnetic flux generated by the primary power transmission coil 6.

The open end surface (or the area surrounding by the wire) of the power transmission coil 6 is rectangular in shape with the short sides measuring N and the long sides measuring M. When the outer diameter of each secondary power reception coil 4 placed on the support table 3 is Q, the short side length N should be less than four times the outer diameter Q of the secondary power reception coil 4, and the long side length M should be less than six times the outer diameter Q of the secondary power reception coil 4.

If the short side length N is greater than four times the outer diameter Q of the secondary power reception coil 4, the transmission efficiency is reduced. Even if the short side length N is less than four times the outer diameter Q of the secondary power reception coil 4, if the long side length M is greater than six times the outer diameter Q of the secondary power reception coil 4, the coupling coefficient between the primary power transmission coil 6 and the secondary power reception coil 4 is reduced, and this decreases the power transmission efficiency. Therefore, it is preferred that the short side length N is less than three times the outer diameter Q of the secondary power reception coil 4, and the long side length M is less than five times the outer diameter Q of the secondary power reception coil 4. It is even more preferable if the short side length N is less than twice the outer diameter Q of the secondary power reception coil 4, and the long side length M is less than three times the outer diameter Q of the secondary power reception coil 4.

Figure 4:
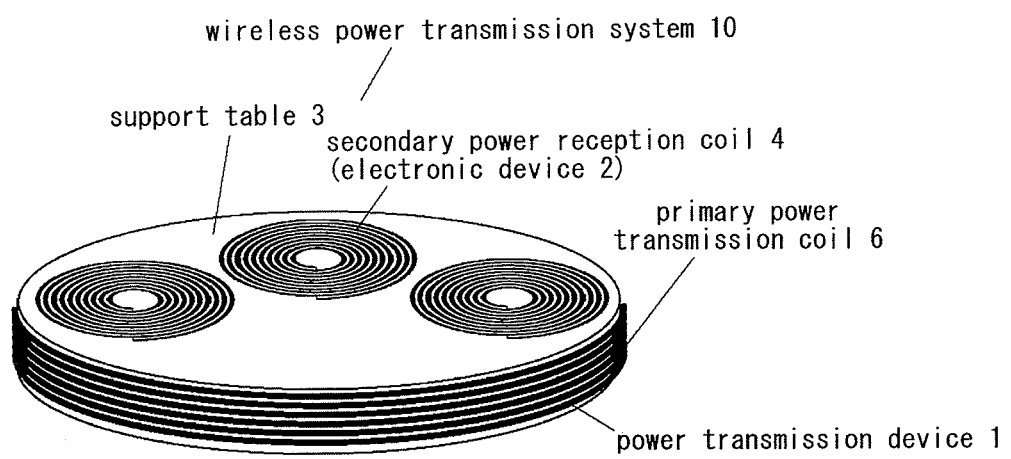
FIG. 4 is a perspective view showing a second embodiment of the wireless power transmission system of the present invention.
Figure 5:
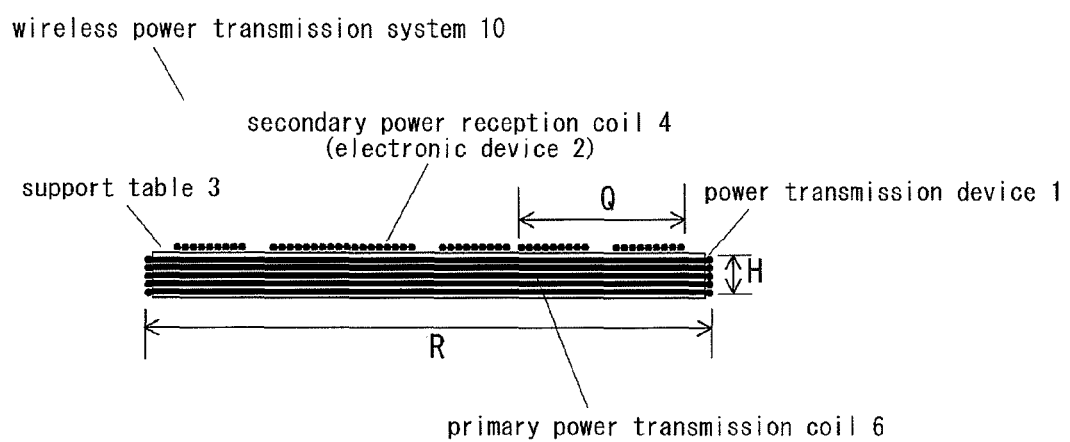
FIG. 5 is a sectional view showing the second embodiment of the wireless power transmission system of the present invention.
Figure 6:
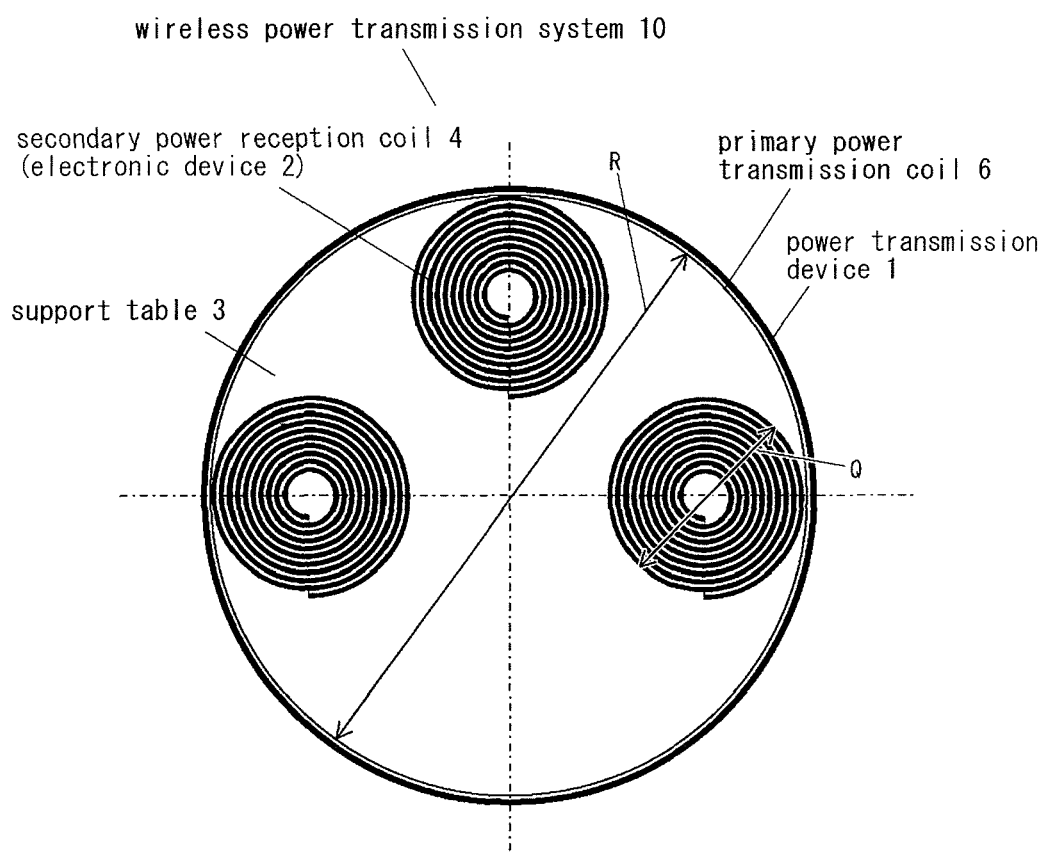
FIG. 6 is a plan view showing the second embodiment of the wireless power transmission system of the present invention.

FIG. 4 is a perspective view showing a second embodiment of the wireless power transmission system of the present invention, FIG. 5 is a sectional view showing the second embodiment of the wireless power transmission system of the present invention, and FIG. 6 is a plan view showing the second embodiment of the wireless power transmission system of the present invention. The second embodiment differs from the first embodiment in the structure of the primary power transmission coil 6, and in the description of the second embodiment, the parts corresponding to those of the first embodiment are denoted with like numerals without necessarily repeating the description of such parts.

As shown in FIGS. 4 to 6, the primary power transmission coil 6 consists of a vertical helical coil having a cylindrical shape with a diameter R. The height H is given as the distance between the upper most turn of the coil wire and the lower most turn of the coil wire. Each secondary power reception coil 4 consisting of a planar spiral coil of electroconductive wire is placed on the support table 3 of the power transmission device 1.

The open end of the primary power transmission coil 6 (the area surrounded by the coil wire) is circular in shape, and has a diameter R. The diameter R of the primary power transmission coil 6 should be less than four times the outer diameter Q of the secondary power reception coil 4 placed thereon. The diameter R is preferably less than three times, and more preferably less than twice the outer diameter Q of the secondary power reception coil 4.

Figure 8:
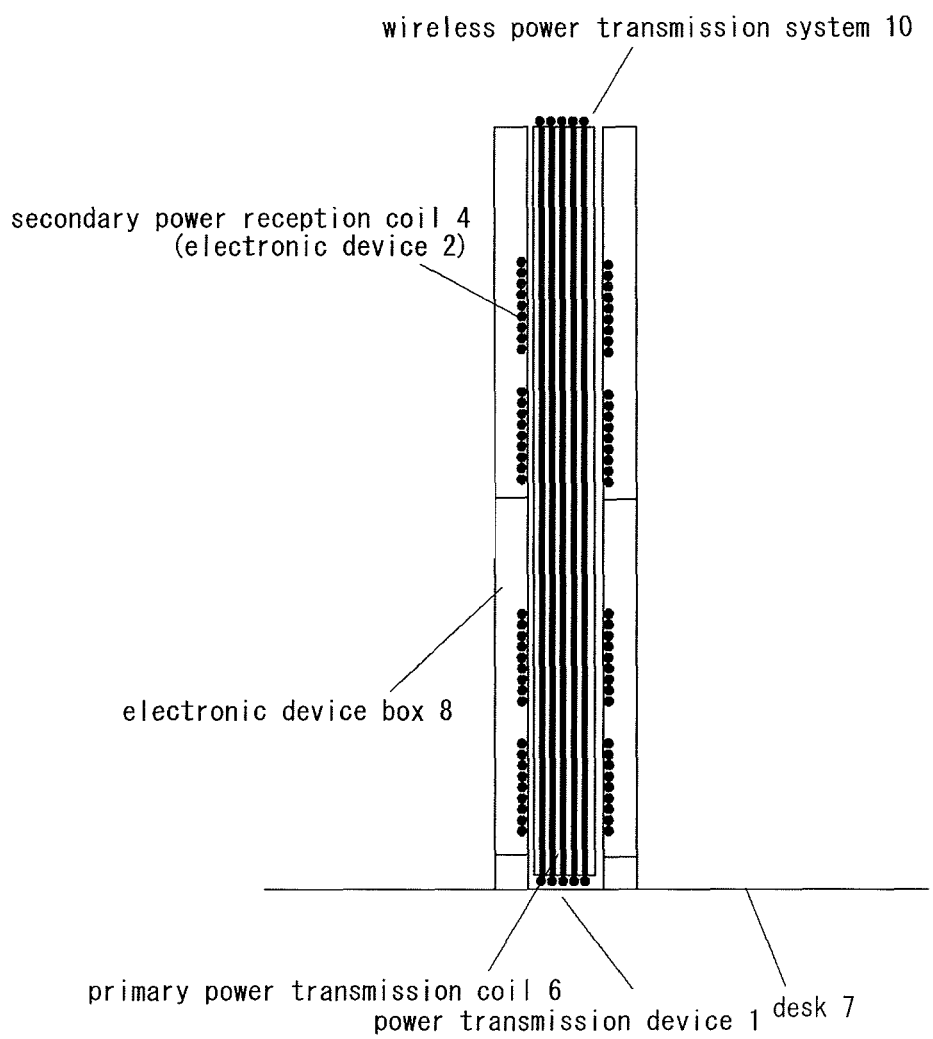
FIG. 8 is a sectional view showing the third embodiment of the wireless power transmission system of the present invention.
Figure 9:
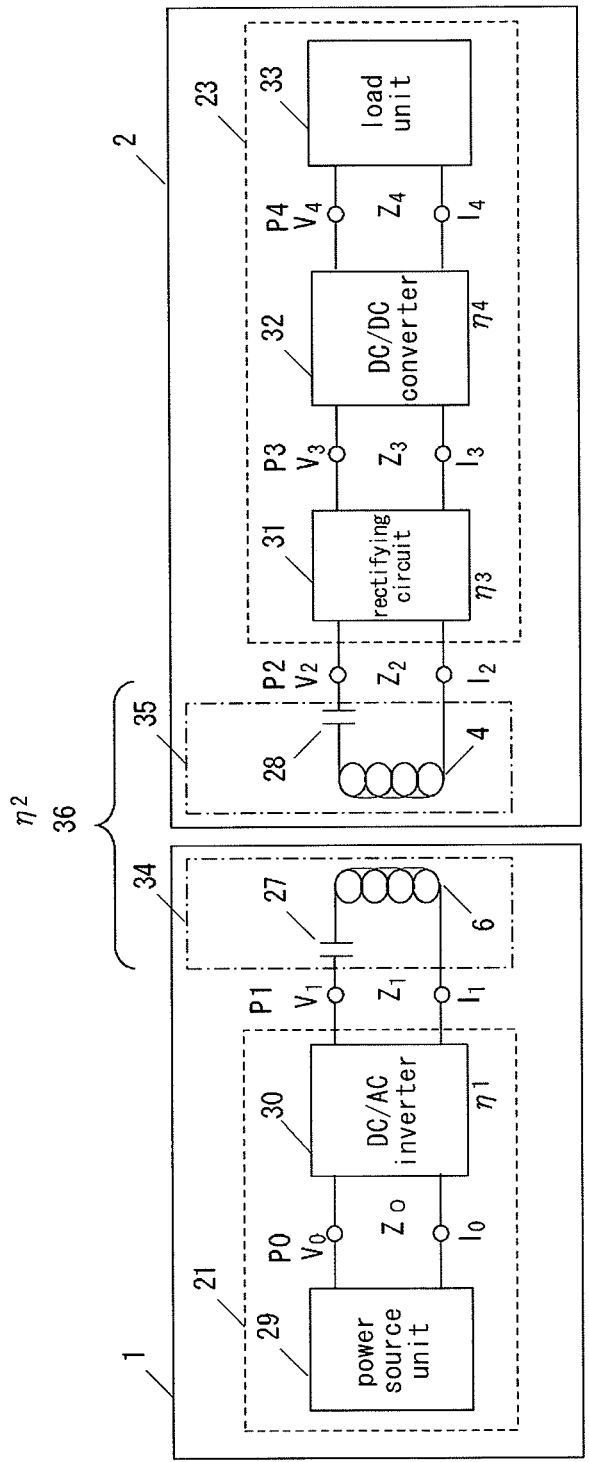
FIG. 9 is a circuit diagram of the wireless power transmission systems embodying the present invention.

FIG. 8 is a sectional view showing the third embodiment of the wireless power transmission system of the present invention, and FIG. 9 is a circuit diagram for the circuit structures of the wireless power transmission systems embodying the present invention.

In the wireless power transmission systems 10 of the first and second embodiments, the primary power transmission coil 6 was horizontally disposed such that the electronic devices 2 may be placed on the upper surface of the power transmission device 1. However, in the wireless power transmission system 10 of the third embodiment, the primary power transmission coil 6 is vertically disposed on the mounting surface of a desk 7 or the like for the power transmission device 1 as shown in FIGS. 7 and 8.

A plurality of electronic device boxes 8 are provided on side parts of the power transmission device 1 each for receiving an electronic device 2 therein. In the embodiment illustrated in FIGS. 7 and 8, a pair of electronic device boxes 8 are provided on each lateral side of the primary power transmission coil 6. In other words, in the illustrated embodiment, the power transmission device 1 is provided with four electronic device boxes 8. When a plurality of identical electronic devices 2 such as electronic devices for business purposes are to be recharged at the same time, the electronic devices 2 can be arranged in different vertical levels so that the space on the desk 7 can be effectively utilized.

Figure 7:
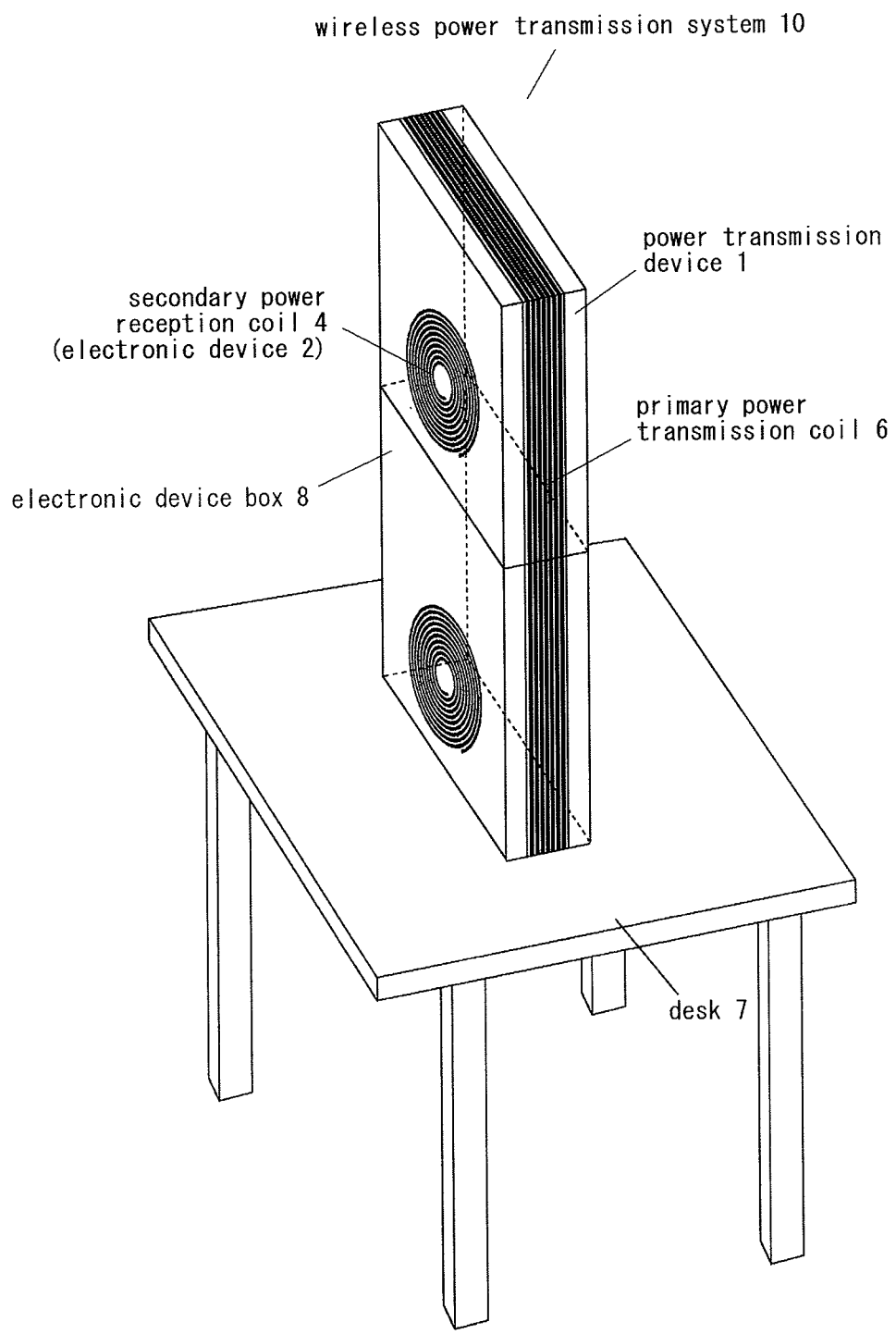
FIG. 7 is a perspective view showing a third embodiment of the wireless power transmission system of the present invention.

Furthermore, as shown in FIG. 7, the electronic devices 2 may be arranged on two sides of the primary power transmission coil 6 to recharge a number of electronic devices 2 at the same time. This allows the space on the desk 7 to be utilized even more efficiently. By placing the primary power transmission coil 6 in this vertical arrangement, the contact surface between the power transmission device 1 and each electronic device 2 is substantially perpendicular to the top surface of the desk 7 so that an inadvertent inclusion of a metallic piece or other foreign object between the power transmission device 1 and the electronic device 2 is avoided.

The circuit structure of the wireless power transmission system 10 is described in the following with reference to FIG. 9 which shows the circuit structure of the wireless power transmission system embodying the present invention.

As shown in FIG. 9, the wireless power transmission system 10 comprises a power transmission circuit unit 21, a power reception circuit unit 23 and a transmission circuit unit 36. The transmission circuit unit 36 comprises a primary transmission circuit unit 34 and a secondary reception circuit unit 35. The primary transmission circuit unit 34 is provided on the side of the power transmission device 1, and the secondary reception circuit unit 35 is provided on the side of each electronic device 2.

The power transmission circuit unit 21 comprises a power source unit 29 and a DC/AC inverter 30, and the power source unit 29 includes a AC/DC inverter (not shown in the drawings) that converts the AC power supplied from the utility power source to corresponding DC power to be supplied to the DC/AC inverter 30. The DC/AC inverter 30 converts this DC power into AC power of a prescribed angular frequency ω to be supplied to the primary transmission circuit unit 34.

The primary transmission circuit unit 34 includes a primary power transmission coil 6 and a primary capacitor 27 connected in series to the primary power transmission coil 6. The primary power transmission coil 6 and the primary capacitor 27 jointly form a series resonance circuit which generates an oscillating magnetic flux at the resonant frequency $f$ $(=\omega/2\pi)$.

The secondary reception circuit unit 35 includes a secondary power reception coil 4 and a secondary capacitor 28 connected in series to the secondary power reception coil 4. This series resonance circuit induces an AC voltage in the secondary power reception coil 4 owing to the electromagnetic induction from the primary power transmission coil 6. This AC voltage is supplied from the secondary reception circuit unit 35 to the power reception circuit unit 23.

The power reception circuit unit 23 includes a load unit 33 (which may include a rechargeable battery and a power feed circuit unit not shown in the drawings), a DC/DC converter 32 and a rectifying circuit 31. The rectifying circuit 31 rectifies and smoothes the AC voltage supplied by the secondary reception circuit unit 35 into a DC voltage to be supplied to the DC/DC converter 32. The DC/DC converter 32 converts this DC voltage into another prescribed DC voltage to be supplied to the load unit 33. This DC voltage is supplied to a rechargeable battery (not shown in the drawings) via a power feed circuit unit (not shown in the drawings).

The letters $\eta_1$ to $\eta_4$ that are indicated on the power source unit 29, the DC/AC inverter 30, the transmission circuit unit 36, the rectifying circuit 31, the DC/DC converter 32 and the load unit 33 each represent the corresponding power transmission efficiency. The letters $P_0$ to $P_4$ indicated between each adjoining pair of these units each represent the corresponding output power (W), the letters $V_0$ to $V_4$ each represent the corresponding output voltage (V), the letters $I_0$ to $I_4$ each represent the corresponding output current (A), and the letters $Z_0$ to $Z_4$ each represent the corresponding output impedance (Ω). In the following is discussed the desired input and output properties of the wireless power transmission system.

The electric power supplied to the load unit 33 is given by the output of the DC/DC converter 32. Suppose that the electric power and the voltage required to be supplied to the load unit 33 is $P_4$=7.5 (W) and $V_4$=5 (V). Then, the output current $I_4$ $(=P_4/V_4)$ and the output resistance $Z_4$ $(=V_4/I_4)$ are 1.5 (A) and 3.3 (Ω), respectively.

Suppose that the transmission efficiency of the DC/DC converter 32 is $\eta_4$=92%. Then, the input power $P_3$ $(=P_4/\eta_4)$ to the DC/DC converter 32 is 8.2 (W). If the DC/DC converter 32 converts 10 V into 5 V, the input voltage $V_3$ is 10 (V), and the input current $I_3$ $(=P_3/V_3)$ and the input resistance $Z_3$ $(=V_3/I_3)$ in this case are 0.8 (A) and 12.3 (Ω), respectively. The input power $P_3$, the input voltage $V_3$, the input current $I_3$ and the input resistance $Z_3$ of the DC/DC converter 32 provide the output property of the rectifying circuit 31.

Suppose that the transmission efficiency of the rectifying circuit 31 is $\eta_3$=92%. Then, the input power $P_2$ $(=P_3/\eta_3)$ to the rectifying circuit 31 is 8.9 (W). If the input voltage $V_2$ of the rectifying circuit 31 is equal to the output voltage $V_3$ thereof, the input voltage $V_2$ is 10 V, and the input current $I_2$ $(=P_2/V_2)$ and the input resistance $Z_2$ $(=V_2/I_2)$ in this case are 0.9 (A) and 11.3 (Ω), respectively. The input power $P_2$, the input voltage $V_2$, the input current $I_2$ and the input resistance $Z_2$ of the rectifying circuit 31 provide the output property of the secondary reception circuit unit 35 of the transmission circuit unit 36.

Suppose that the transmission efficiency of the transmission circuit unit 36 is $\eta_2$=92%. Then, the input power $P_1$ $(=P_2/\eta_2)$ to the primary power transmission coil 6 is 9.6 (W). If the primary coil and the secondary coil have a same resistance, the input voltage $V_1$ (=$V_2/(\eta_2)^{1/2}$) of the primary power transmission coil 6 can be determined as $V_1$=10.4 V. The input current $I_1$ and the input resistance $Z_1$ in this case are 0.9 (A) and 11.3 (Ω), respectively. The input power $P_1$, the input voltage $V_1$, the input current $I_1$ and the input resistance $Z_1$ of the primary power transmission coil provide the output property of the DC/AC inverter 30.

Suppose that the transmission efficiency of the DC/AC inverter 30 is $\eta_1$=92%. Then, the input power $P_0$ of the DC/AC inverter 30 is 10.5 (W). If the input voltage $V_0$ of the DC/AC inverter 30 is equal to the output voltage $V_1$ of the DC/AC inverter 30, $V_0$=10.4 (V). The input current $I_0$ and the input resistance $Z_0$ at this time are 1.0 (A) and 10.4 (Ω), respectively. The properties mentioned above are summarized in Table 1. Based on the ultimately required electric power property for the load unit 33, the input and output properties of the power reception circuit unit 23, the transmission circuit unit 36 and the power transmission circuit unit 21 are computed, and the necessary input power source capacity can be determined therefrom.

TABLE 1

|  | DC/DC output | | DC/DC input | | rectifying circuit output | | rectifying circuit input | |
|---|---|---|---|---|---|---|---|---|
| power (W) | $P_4$ | 7.5 | $P_3$ | 8.2 | $P_3$ | 8.2 | $P_2$ | 8.9 |
| voltage (V) | $V_4$ | 5 | $V_3$ | 10 | $V_3$ | 10 | $V_2$ | 10 |
| current (A) | $I_4$ | 1.5 | $I_3$ | 0.8 | $I_3$ | 0.8 | $I_2$ | 0.9 |
| resistance (Ω) | $Z_4$ | 3.3 | $Z_3$ | 12.3 | $Z_3$ | 12.3 | $Z_2$ | 11.3 |
| efficiency (%) | $\eta_1$ | 92 | $\eta_4$ | 92 | $\eta_3$ | 92 | $\eta_3$ | 92 |
|  | secondary coil output | | primary coil input | | inverter output | | inverter input | |
| power (W) | $P_2$ | 8.9 | $P_1$ | 9.6 | $P_1$ | 9.6 | $P_0$ | 10.5 |
| voltage (V) | $V_2$ | 10 | $V_1$ | 10.4 | $V_1$ | 10.4 | $V_0$ | 10.4 |
| current (A) | $I_2$ | 0.9 | $I_1$ | 0.9 | $I_1$ | 0.9 | $I_0$ | 1 |
| resistance (Ω) | $Z_2$ | 11 | $Z_1$ | 11.3 | $Z_1$ | 11.3 | $Z_0$ | 10.4 |
| efficiency (%) | $\eta_2$ | 90 | $\eta_2$ | 92 | $\eta_1$ | 92 | $\eta_1$ | 92 |

How the values of the circuit elements in the transmission circuit unit 36 can be determined is described in the following with respect to the diagram shown in FIG. 9. The values of the circuit elements of the transmission circuit unit are determined by taking into account the impedances of the power reception circuit unit 23 and the power transmission circuit unit 21.

AC power at angular frequency ω is transmitted from the DC/AC inverter 30 forming a part of the power transmission circuit unit 21 to the primary transmission circuit unit 34 forming a part of the transmission circuit unit 36. AC power is induced in the secondary power reception coil 4 of the secondary reception circuit unit 35 by electromagnetic induction from the primary power transmission coil 6 of the primary transmission circuit unit 34.

The primary transmission circuit unit 34 includes a series resonance circuit formed by connecting the primary capacitor 27 in series to the primary power transmission coil 6. Similarly, the secondary reception circuit unit 35 includes a series resonance circuit formed by connecting the secondary capacitor 28 in series to the secondary power reception coil 4.

If the impedance of the transmission circuit unit 36 as seen from the power transmission circuit unit 21 connected to the primary transmission circuit unit 34 is given by $Z_1$, the self inductance $L_1$ of the primary power transmission coil 6 can be computed from the coupling coefficient K between the two coils and the transmitted angular frequency ω by the following equation.

$$L_1 = Z_1/\omega K$$

The capacitance $C_1$ of the primary capacitor 27 can be computed by the following equation.

$$C_1 = 1/L_1\omega^2$$

Similarly, if the impedance of the power reception circuit unit 23 connected to the secondary reception circuit unit 35 is $Z_2$, the self inductance $L_2$ of the secondary power reception coil 4 can be computed by the following equation.

$$L_2 = Z_2/\omega K$$

The capacitance $C_2$ of the secondary capacitor 28 can be computed by the following equation.

$$C_2 = 1/L_2\omega^2$$

The self inductance $L_1$ of the primary power transmission coil 6, the capacitance $C_1$ of the primary capacitor 27, the self inductance $L_2$ of the secondary power reception coil 4 and the capacitance $C_2$ of the secondary capacitor 28 are determined in such a manner that a resonance at angular frequency ω may be achieved. Thereby, an impedance matching between the power reception circuit unit 23 and the power transmission circuit unit 21 can be achieved in the transmission circuit unit 36 including the primary power transmission coil 6 and the secondary power reception coil 4 each forming a series resonance circuit.

As a result, even when the position of the electronic device 2 varies from the center to an end area of the primary power transmission coil 6, the changes in the coupling coefficient between the primary power transmission coil 6 and the secondary power reception coil 4 is minimized so that a positioning free power feeding can be achieved.

Also, when a plurality of electronic device 2 are placed on the power transmission device 1, the total power required by the electronic devices 2 can be supplied from the primary power transmission coil 6, and the secondary power reception coils 4 can receive electric power from the primary power transmission coil 6 at the same time so that the so-called multi power feeding can be accomplished.

It is also possible to exchange identification information between the electronic devices 2 and the power transmission device 1 so that a mutual authentification or verification may be performed. Only when a mutual verification is established between each electronic device 2 and the power transmission device 1, the power transmission is performed from the primary power transmission coil 6 to the secondary power reception coil 4 to charge the rechargeable battery (not shown in the drawings) of the particular electronic device 2.

Prior to recharging the rechargeable battery (not shown in the drawings) by inducing AC voltage in the secondary power reception coil 4 owing to the mutual induction between the primary power transmission coil 6 and the secondary power reception coil 4, it is preferable to detect if an electronic device 2 is placed on the support table of the power transmission device 1. It is also desirable to detect the state of the electronic device 2, such as the temperature thereof, the charge state of the rechargeable battery and the voltage fluctuations in the secondary power reception coil 4, by incorporating a suitable power reception control unit in the system.

PREFERRED EMBODIMENT(S)

The wireless power transmission system 10 of the present invention is described in the following in terms of specific examples.

Example 1

Figure 10:
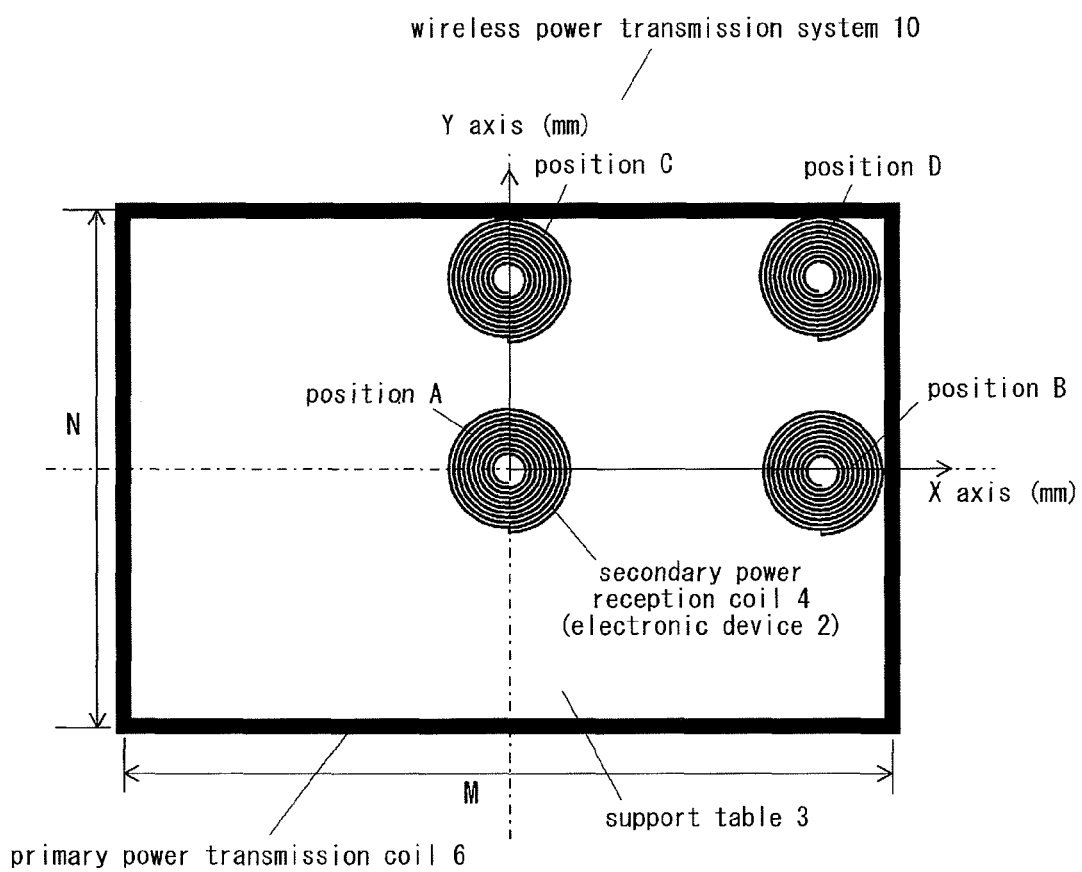
FIG. 10 is a plan view of the wireless power transmission system 10 embodying the present invention

Wireless power transmission was performed from the power transmission device 1 to the electronic devices 2 in the wireless power transmission system 10 shown in FIGS. 1, 8 and 10. FIG. 10 is a plan view of the wireless power transmission system 10 embodying the present invention. The primary power transmission coil 6 consists of a vertical helical coil having a rectangular configuration with a long side length M of 240 mm, a short side length N of 160 mm and a height H of 16 mm. This vertical coil is formed by winding copper wire having a diameter of 0.8 mm around the side of an acrylic base member by 20 turns. The secondary power reception coil 4 of the electronic device 2 placed on the power transmission device 1 is formed by winding copper wire having a diameter of 0.8 mm in a planar spiral configuration with an inner diameter of 10 mm and an outer diameter Q of 40 mm.

When the coupling coefficient K between the primary power transmission coil 6 and the secondary power reception coil 4 is 0.063, the transmission frequency f is 150 KHz, the impedance $Z_1$ of the transmission circuit unit 36 as seen from the power transmission circuit unit 21 is 10Ω and the impedance $Z_2$ of the power reception circuit unit 23 is 10Ω, the self inductance $L_1$ of the primary power transmission coil 6 can be computed by $L_1=Z_1/\omega K$, the self inductance $L_2$ of the secondary power reception coil 4 can be computed by $L_2=Z_2/\omega K$, the capacitance $C_1$ of the primary capacitor 27 can be computed by $C_1=1/L_1\omega^2$, and the capacitance $C_2$ of the secondary capacitor 28 can be computed by $C_1=1/L_1\omega^2$. Therefore, the self inductance $L_1$ of the primary power transmission coil 6 of the primary transmission circuit unit 34 was determined as 168.4 (μH), the self inductance $L_2$ of the secondary power reception coil 4 was determined as 168.4 (μH), the capacitance $C_1$ of the primary capacitor was determined as 6.68 (nF), and the capacitance $C_2$ of the secondary capacitor was determined as 6.68 (nF). The transmission circuit was built by using such circuit constants, and the transmission property measured by using a vector network analyzer is shown in FIGS. 11 to 14.

As shown in FIG. 10, the secondary power reception coil 4 was placed at position A or the center of the primary power transmission coil 6, and at position B or the right end part of the primary power transmission coil 6. As the long side length M (of the primary power transmission coil 6) was 240 mm and the outer diameter Q (of the secondary power reception coils 4) was 40 mm, if position A is given as the zero point of the X axis, position B is offset from the center by the distance of 100 mm along the X axis.

The secondary power reception coil 4 was also placed at position C or the upper end of the primary power transmission coil 6. As the long side length M (of the primary power transmission coil 6) was 240 mm and the outer diameter Q (of the secondary power reception coils 4) was 40 mm, if position A is given as the zero point of the Y axis, position C is offset from the center by 60 mm along the Y axis. The secondary power reception coil 4 was additionally placed at position D or the upper right corner of the primary power transmission coil 6. Position D is offset from the center by 100 mm along the X axis and by 60 mm along the Y axis.

Figure 11:
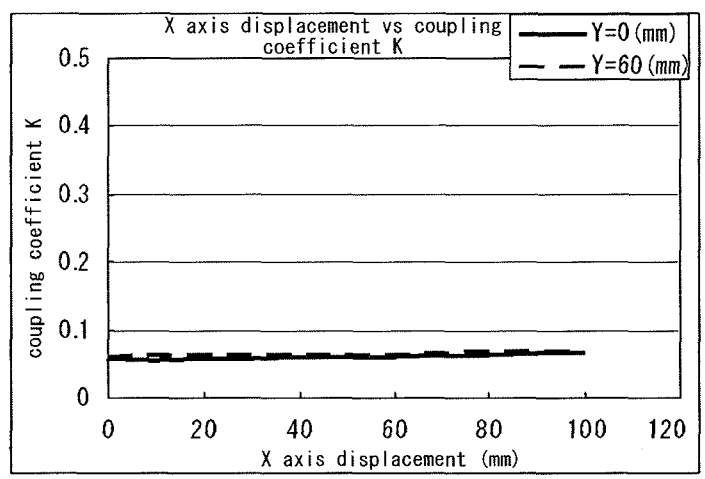
FIG. 11 is a graph showing the change in the coupling coefficient when the secondary power reception coil is moved along the X axis according to an embodiment of the present invention.
Figure 12:
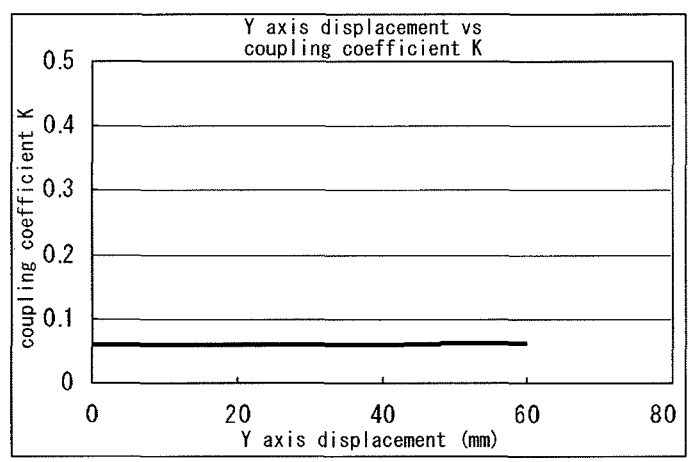
FIG. 12 is a graph showing the change in the coupling coefficient when the secondary power reception coil is moved along the Y axis according to an embodiment of the present invention.
Figure 13:
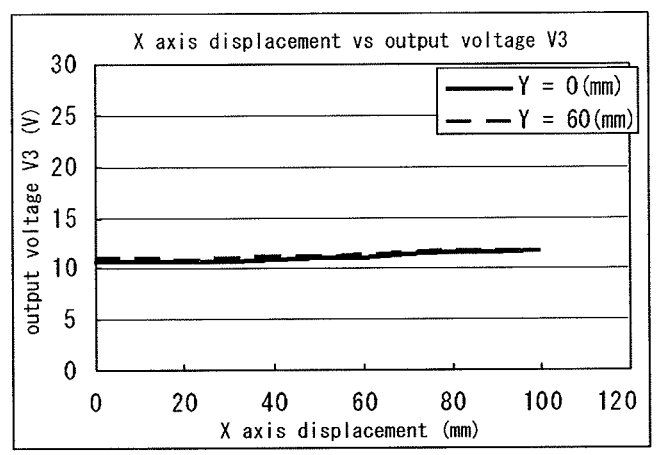
FIG. 13 is a graph showing the change in the output voltage when the secondary power reception coil is moved along the X axis according to an embodiment of the present invention.
Figure 14:
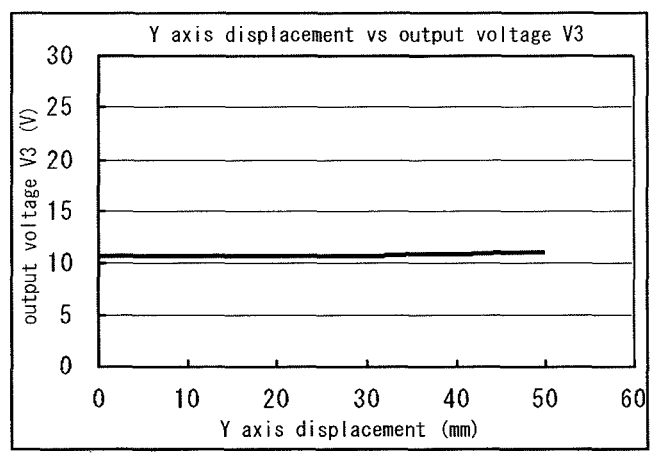
FIG. 14 is a graph showing the change in the output voltage when the secondary power reception coil is moved along the Y axis according to an embodiment of the present invention.

The change in the coupling coefficient K when the secondary power reception coils 4 is moved from the zero point on the X axis to the 100 mm point on the X axis is shown in FIGS. 11 and 12, and the corresponding change in the output voltage $V_3$ of the rectifying circuit 31 is shown in FIGS. 13 and 14.

FIG. 11 is a graph in which the horizontal axis corresponds to the X axis (See FIG. 10) and the vertical axis corresponds to the coupling coefficient K. In other words, this graph shows the change in the coupling coefficient K when the secondary power reception coil 4 is moved from the zero point on the X axis of the primary power transmission coil 6 to the right end of the X axis with the position on the Y axis (0 mm and 60 mm) given as a parameter. In other words, this shows the property when the secondary power reception coil 4 is moved from position A to position B (Y=0 mm), and when the secondary power reception coil 4 is moved from position C to position D (Y=60 mm) in FIG. 10.

FIG. 12 is a graph in which the horizontal axis corresponds to the Y axis (See FIG. 10) and the vertical axis corresponds to the coupling coefficient K. In other words, this graph shows the change in the coupling coefficient K when the secondary power reception coil 4 is moved from the zero point on the Y axis of the primary power transmission coil 6 to the upper end of the Y axis. In other words, this shows the property when the secondary power reception coil 4 is moved from position A to position C in FIG. 10.

As can be seen from FIGS. 11 and 12, the coupling coefficient K changes very little when the position of the secondary power reception coil 4 is changed.

FIG. 13 is a graph in which the horizontal axis corresponds to the X axis (See FIG. 10) and the vertical axis corresponds to the output voltage $V_3$. In other words, this graph shows the change in the output voltage $V_3$ from the rectifying circuit 31 when the secondary power reception coil 4 is moved from the zero point on the X axis of the primary power transmission coil 6 to the right end of the X axis with the position on the Y axis (0 mm and 60 mm) given as a parameter. In other words, this shows the property when the secondary power reception coil 4 is moved from position A to position B (Y=0 mm), and when the secondary power reception coil 4 is moved from position C to position D (Y=60 mm) in FIG. 10.

FIG. 14 is a graph in which the horizontal axis corresponds to the Y axis (See FIG. 10) and the vertical axis corresponds to the output voltage $V_3$. In other words, this graph shows the change in the output voltage $V_3$ from the rectifying circuit 31 when the secondary power reception coil 4 is moved from the zero point on the Y axis of the primary power transmission coil 6 to the upper end of the Y axis. In other words, this shows the property when the secondary power reception coil 4 is moved from position A to position C in FIG. 10.

As can be seen from FIGS. 13 and 14, the output voltage $V_3$ from the rectifying circuit 31 changes very little when the position of the secondary power reception coil 4 is changed. In other words, the power transmission property changes very little no matter where on the support table 3 incorporated with the primary power transmission coil 6 the secondary power reception coil 4 is placed so that a positioning free power feeding can be achieved.

Example for Comparison 1

Figure 15:
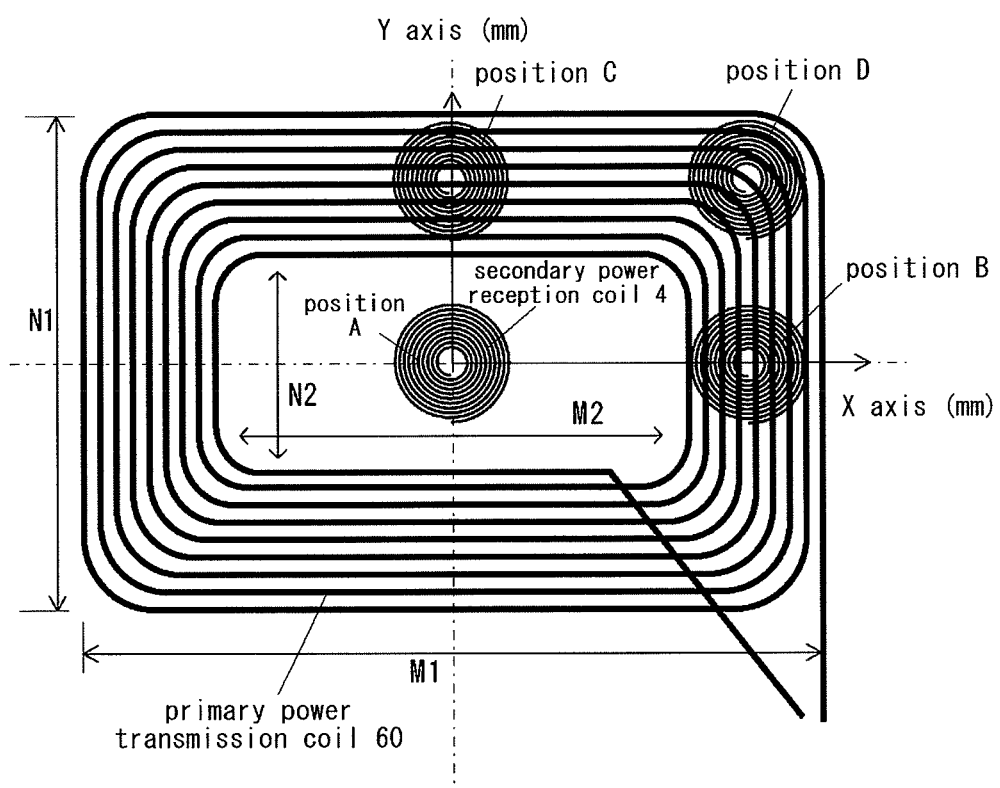
FIG. 15 is a plan view of a wireless power transmission system given as an example for comparison.
Figure 16:
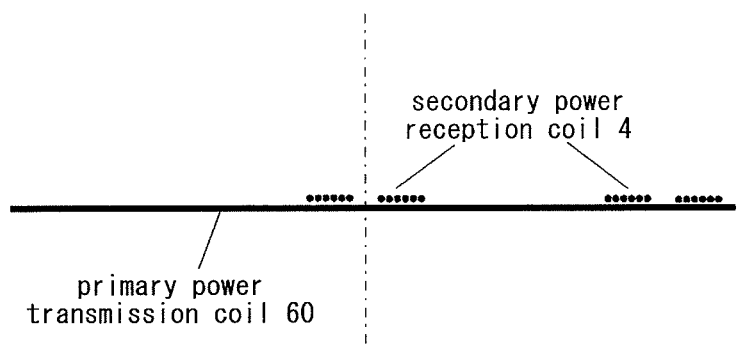
FIG. 16 is a front view of the wireless power transmission system given as an example for comparison.

FIGS. 15 and 16 show an example of a wireless power transmission system for comparison. FIG. 15 is a plan view of the example of a wireless power transmission system for comparison, and FIG. 16 is a front view of the example of a wireless power transmission system for comparison. The primary power transmission coil 60 consists of a planar spiral coil of copper wire having a diameter of 0.8 mm, and is provided with an outer periphery with a long side length M1 of 240 mm and a short side length N1 of 160 mm, and an inner periphery with a long side length M2 of 112 mm and a short side length N2 of 51 mm.

Figure 17:
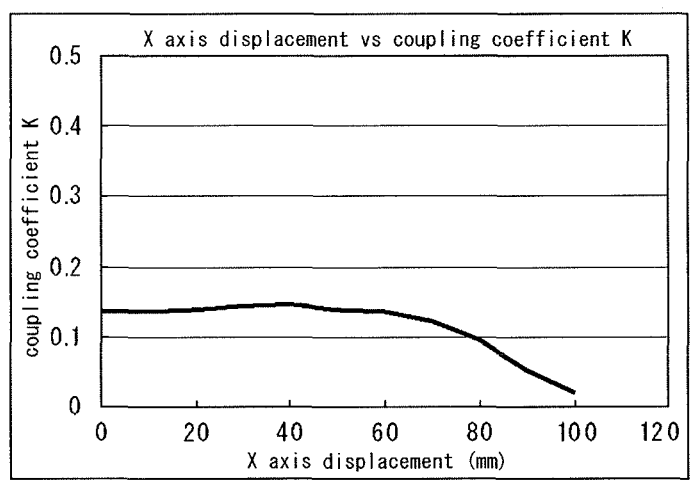
FIG. 17 is a graph showing the change in the coupling coefficient when the secondary power reception coil is moved along the X axis in the example for comparison.
Figure 18:
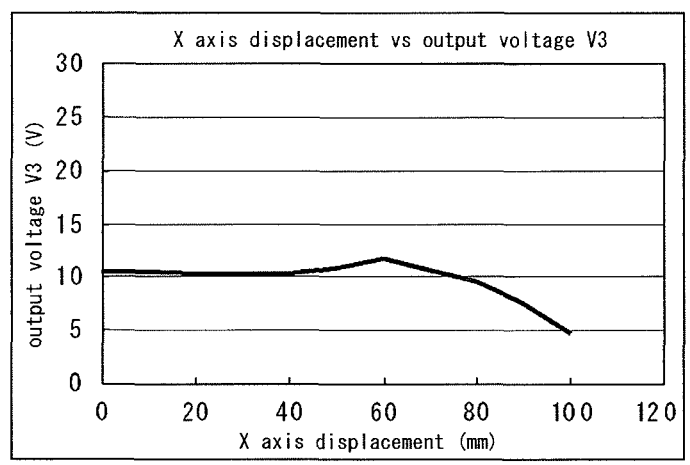
FIG. 18 is a graph showing the change in the output voltage when the secondary power reception coil is moved along the X axis in the example for comparison.

FIG. 17 shows the changes in the coupling coefficient K when the secondary power reception coil 4 is moved from position A or the zero point on the X axis and position B or 100 mm away therefrom on the X axis, and FIG. 18 shows the corresponding changes in the output voltage $V_3$ from the rectifying circuit 31.

As shown in FIGS. 15 and 16, as the secondary power reception coil 4 is moved from the center to the right end of the primary power transmission coil 60, the coupling coefficient K diminishes progressively toward the right end of the X axis, and the output voltage $V_3$ from the rectifying circuit 31 similarly diminishes. In other words, according to the structure illustrated in FIGS. 15 and 16, the power transmission efficiency diminishes significantly depending on the position of the secondary power reception coil 4. Therefore, the position for the secondary power reception coil 4 must be appropriately designated for an efficient power transmission so that a positioning free power feeding cannot be achieved. A similar tendency can be observed also when the secondary power reception coil 4 is moved along the Y axis.

In the following is given some discussion on the preferred embodiments and the actual example.

As discussed above, the wireless power transmission system 10 of the present invention is designed such that the following relationships hold.

$$\omega L_1 = Z_1/K$$

$$\omega L_2 = Z_2/K$$

Thereby, the input and output impedances of the transmission circuit unit 36 are properly matched. Additionally, the coupling coefficient K is considered for this impedance matching. As shown in FIGS. 11 and 12, even when the coupling coefficient K is small (less than 0.1), electric power can be transmitted in an efficient manner.

As can be appreciated from the foregoing relationships, the self inductance $L_1$ depends on the input impedance $Z_1$ and the coupling coefficient K. The coupling coefficient K can be obtained from the self inductances $L_1$ and $L_2$. Therefore, the self inductance $L_1$ essentially depends on the self inductance $L_2$. Similarly, the self inductance $L_2$ depends on the output impedance $Z_2$ and the coupling coefficient K, and hence on the self inductance $L_1$.

The primary power transmission coil 6 is not limited to the coil configurations discussed above, but preferably consists of a vertical helical coil. In the case of the primary power transmission coil 60 consisting of a planar spiral coil as shown in FIG. 15, the coupling coefficient K changes depending on the positional relationship between the secondary power reception coil 4 and the primary power transmission coil 60 as shown in FIG. 17. This is attributed to the fact that the magnetic field generated by a planar coil is not uniform, but stronger in the central part as compared to the peripheral part. As discussed above, the input and output impedances of the transmission circuit unit 36 are matched by using the coupling coefficient K. The output voltage $V_3$ decreases when the coupling coefficient K is changed as shown in FIG. 18. For instance, when L1 and L2 are determined by using the value of the coupling coefficient K when the secondary power reception coil 4 is located at position A in FIG. 15, the transmission efficiency drops when the secondary power reception coil 4 is relocated to position D in FIG. 15. In other words, the acceptable area on the primary power transmission coil 60 for placing the secondary power reception coil 4 is so limited that a positioning free power feeding cannot be achieved.

On the other hand, as shown in FIG. 10, in the illustrated embodiments, the primary power transmission coil 6 consists of a vertical helical coil which is formed by winding a linear conductor around the central axial line of the primary power transmission coil 6. In this case, as shown in FIGS. 11 and 12, the coupling coefficient K does not essentially change even when the secondary power reception coil 4 is displaced. Therefore, without regard to the positioning of the secondary power reception coil 4, the input and output impedance matching can be achieved. Therefore, the output voltage V3 can be obtained in a stable manner as shown in FIGS. 13 and 14. In other words, the permissible area for placing the secondary power reception coil 4 is so expanded that a positioning free power feeding can be achieved.

INDUSTRIAL APPLICABILITY

The wireless power transmission system of the present invention prevents the reduction in the transmission efficiency without requiring any precise position between the primary power transmission coil and the secondary power reception coil, and allows electric power to be fed from a single primary power transmission coil to a plurality of secondary power reception coils.

GLOSSARY 1 power transmission device
2 electronic device
3 support table
4 secondary power reception coil
6 primary power transmission coil
7 desk
8 electronic device box
10 wireless power transmission system
21 power transmission circuit unit
23 power reception circuit unit
27 primary capacitor
28 secondary capacitor
29 power source unit
30 DC/AC converter
31 rectifying circuit
32 DC/DC converter
33 load unit
34 primary transmission circuit unit
34 secondary transmission circuit unit
36 transmission circuit unit

The invention claimed is:

1. A power transmission device for transmitting electric power in a wireless manner to an electronic device, the electronic device including a secondary power reception coil and a power reception circuit configured to receive electric power via the secondary power reception coil, the power transmission device comprising:
 a primary power transmission coil; and
 a power transmission circuit that supplies electric power to the primary power transmission coil, the electric power supplied to the primary power transmission coil being transmitted to the secondary power reception coil,
 wherein a first impedance which corresponds to an input impedance of a transmission circuit, including the primary power transmission coil and the secondary power reception coil coupled to the primary power transmission coil, and to an impedance of the transmission circuit seen by the power transmission circuit, is matched with a second impedance which corresponds to an output impedance of the transmission circuit and to an impedance of the power reception circuit of the electronic device, by using a coupling coefficient between the primary power transmission coil and the secondary power reception coil, wherein, when the power transmission circuit supplies AC electric power at angular frequency ω to the primary power transmission coil, $$\omega L_1 = Z_1/K$$

$$\omega L_2 = Z_2/K,$$

where $L_1$ is a first inductance of the primary power transmission coil, $L_2$ is a second inductance of the secondary power reception coil, $Z_1$ is the first impedance, $Z_2$ is the second impedance, and K is the coupling coefficient.

2. The power transmission device according to claim 1, wherein the first inductance of the primary power transmission coil has a value based on the coupling coefficient between the primary power transmission coil and the secondary power reception coil.

3. The power transmission device according to claim 2, wherein the value of the first inductance is determined based on the second inductance of the secondary power reception coil.

4. The power transmission device according to claim 3, wherein the value of the first inductance is determined based on the first impedance.

5. The power transmission device according to claim 1, further comprising a primary capacitor that forms a series resonance circuit in cooperation with the primary power transmission coil.

6. The power transmission device according to claim 1, wherein the primary power transmission coil comprises a helical coil.

7. The power transmission device according to claim 6, wherein the primary power transmission coil comprises a linear conductor helically wound around a central axial line of the primary power transmission coil.

8. The power transmission device according to claim 6, wherein an open end of the primary power transmission coil has an area at least twice as large as an area of the secondary power reception coil.

9. An electronic device configured to receive electric power from a power transmission device, the power transmission device including a primary power transmission coil and a power transmission circuit supplying electric power to the primary power transmission coil, the electronic device comprising:

a secondary power reception coil; and a power reception circuit that receives electric power transmitted from the primary power transmission coil via the secondary power reception coil, wherein a second impedance which corresponds to an output impedance of a transmission circuit, including the primary power transmission coil and the secondary power reception coil coupled to the primary power transmission coil, and to an impedance of the power reception circuit, is matched with a first impedance which corresponds to an input impedance of the transmission circuit and to an impedance of the transmission circuit seen by the power transmission circuit, by using a coupling coefficient between the primary power transmission coil and the secondary power reception coil, wherein, when the power transmission circuit supplies AC electric power at angular frequency ω to the primary power transmission coil, $$\omega L_1 = Z_1/K$$

$$\omega L_2 = Z_2/K,$$

where $L_1$ is a first inductance of the primary power transmission coil, $L_2$ is a second inductance of the secondary power reception coil, $Z_1$ is the first impedance, $Z_2$ is the second impedance, and K is the coupling coefficient.

10. A wireless power transmission system, comprising:

a transmission circuit including a primary power transmission coil and a secondary power reception coil coupled to the primary power transmission coil;

a power transmission circuit that transmits power via the primary power transmission coil; and a power reception circuit that receives power transmitted from the primary power transmission coil via the secondary power reception coil, wherein a first impedance which corresponds to an input impedance of the transmission circuit and to an impedance of the power transmission circuit seen by the power transmission circuit, is matched with a second impedance which corresponds to an output impedance of the transmission circuit and to an impedance of the power reception circuit, by using a coupling coefficient between the primary power transmission coil and the secondary power reception coil, wherein, when the power transmission circuit supplies AC electric power at angular frequency ω to the primary power transmission coil, $$\omega L_1 = Z_1/K$$

$$\omega L_2 = Z_2/K,$$

where $L_1$ is a first inductance of the primary power transmission coil, $L_2$ is a second inductance of the secondary power reception coil, $Z_1$ is the first impedance, $Z_2$ is the second impedance, and K is the coupling coefficient.

11. The wireless power transmission system according to claim 10, wherein the primary power transmission coil comprises a helical coil having a linear conductor helically wound around a central axial line of the primary power transmission coil.

12. The wireless power transmission system according to claim 10, wherein an open end of the primary power transmission coil comprises a helical coil having a rectangular shape, the rectangular shape having a short side length less than four times the diameter of the secondary power reception coil and a long side length less than six times the diameter of the secondary power reception coil.

13. The power transmission device according to claim 1, wherein the primary power transmission coil has a rectangular shape, the rectangular shape having a short side length less than four times the diameter of the secondary power reception coil and a long side length less than six times the diameter of the secondary power reception coil.

14. The electronic device according to claim 9, wherein the primary power transmission coil has a rectangular shape, the rectangular shape having a short side length less than four times the diameter of the secondary power reception coil and a long side length less than six times the diameter of the secondary power reception coil.

15. The electronic device according to claim 10, wherein a maximum of the coupling coefficient is less than 0.2, when the secondary power reception coil moves along the primary power transmission coil.

16. The power transmission device according to claim 1, wherein a change in the coupling coefficient is within 0.2 when the secondary power reception coil moves along the primary power transmission coil.

17. The power transmission system according to claim 10, wherein
- the power reception circuit further includes a load configured to receive power from the secondary power reception coil, and
- the power transmission circuit supplies power to the primary power transmission coil, an amount of power supplied being more than an amount of power necessary for the load.

18. The power transmission system according to claim 17, wherein the amount of power supplied to the primary power transmission coil is calculated based on the amount of power necessary for the load.

19. The power transmission system according to claim 17, wherein the amount of power supplied to the primary power transmission coil is calculated based on the amount of power necessary for the load and a power transmission efficiency of components of the power transmission circuit and the power reception circuit.

* * * * *